United States Patent
Huang et al.

(10) Patent No.: US 9,780,214 B2
(45) Date of Patent: Oct. 3, 2017

(54) SEMICONDUCTOR DEVICE INCLUDING FIN- FET AND MANUFACTURING METHOD THEREOF

(71) Applicant: TAIWAN SEMICONDUCTOR MANUFACTURING CO., LTD., Hsinchu (TW)

(72) Inventors: Gin-Chen Huang, Hsinchu (TW); Tzu-Hsiang Hsu, Hsinchu (TW); Chia-Jung Hsu, Hsinchu (TW); Feng-Cheng Yang, Hsinchu (TW); Teng-Chun Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/579,708

(22) Filed: Dec. 22, 2014

(65) Prior Publication Data
US 2016/0181414 A1 Jun. 23, 2016

(51) Int. Cl.
| | | |
|---|---|---|
| *H01L 27/088* | (2006.01) | |
| *H01L 29/78* | (2006.01) | |
| *H01L 29/12* | (2006.01) | |
| *H01L 29/51* | (2006.01) | |
| *H01L 29/66* | (2006.01) | |

(52) U.S. Cl.
CPC ............ *H01L 29/785* (2013.01); *H01L 29/12* (2013.01); *H01L 29/511* (2013.01); *H01L 29/6681* (2013.01)

(58) Field of Classification Search
CPC ..... H01L 29/12; H01L 29/511; H01L 29/6681
USPC ........................................ 257/401, 190, 288
See application file for complete search history.

(56) References Cited

U.S. PATENT DOCUMENTS

| | | |
|---|---|---|
| 7,425,740 B2 | 9/2008 | Liu et al. |
| 7,667,271 B2 | 2/2010 | Yu et al. |
| 8,048,723 B2 | 11/2011 | Chang et al. |
| 8,053,299 B2 | 11/2011 | Xu |

(Continued)

FOREIGN PATENT DOCUMENTS

KR 10-0496891 B1 6/2005

OTHER PUBLICATIONS

Office Action Korean Patent Application No. 10-2015-0153888 dated Oct. 5, 2016 with English translation.

(Continued)

*Primary Examiner* — Long K Tran
(74) *Attorney, Agent, or Firm* — McDermott Will & Emery LLP

(57) ABSTRACT

A semiconductor device includes a first fin structure for a first fin field effect transistor (FET). The first fin structure includes a first base layer protruding from a substrate, a first intermediate layer disposed over the first base layer and a first channel layer disposed over the first intermediate layer. The first fin structure further includes a first protective layer made of a material that prevents an underlying layer from oxidation. The first channel layer is made of SiGe, the first intermediate layer includes a first semiconductor (e.g., SiGe) layer disposed over the first base layer and a second semiconductor layer (e.g., Si) disposed over the first semiconductor layer. The first protective layer covers side walls of the first base layer, side walls of the first semiconductor layer and side walls of the second semiconductor layer.

18 Claims, 11 Drawing Sheets

(56) References Cited

U.S. PATENT DOCUMENTS

| | | |
|---|---|---|
| 8,183,627 B2 | 5/2012 | Currie |
| 8,362,575 B2 | 1/2013 | Kwok et al. |
| 8,367,498 B2 | 2/2013 | Chang et al. |
| 8,415,718 B2 | 4/2013 | Xu |
| 8,440,517 B2 | 5/2013 | Lin et al. |
| 8,497,177 B1 | 7/2013 | Chang et al. |
| 8,497,528 B2 | 7/2013 | Lee et al. |
| 8,609,518 B2 | 12/2013 | Wann et al. |
| 8,610,240 B2 | 12/2013 | Lee et al. |
| 8,618,556 B2 | 12/2013 | Wu et al. |
| 8,633,516 B1 | 1/2014 | Wu et al. |
| 8,680,576 B2 | 3/2014 | Ching et al. |
| 8,703,565 B2 | 4/2014 | Chang et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,796,759 B2 | 8/2014 | Perng et al. |
| 8,809,139 B2 | 8/2014 | Huang et al. |
| 8,815,712 B2 | 8/2014 | Wan et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 2005/0035391 A1 | 2/2005 | Lee et al. |
| 2007/0221956 A1 | 9/2007 | Inaba |
| 2011/0068407 A1 | 3/2011 | Yeh et al. |
| 2011/0108920 A1 | 5/2011 | Basker et al. |
| 2013/0011983 A1 | 1/2013 | Tsai et al. |
| 2013/0285153 A1 | 10/2013 | Lee et al. |
| 2014/0138770 A1 | 5/2014 | Van Dal et al. |
| 2014/0183600 A1 | 7/2014 | Huang et al. |
| 2014/0197457 A1 | 7/2014 | Wang et al. |
| 2014/0252412 A1 | 9/2014 | Tsai et al. |
| 2014/0264590 A1 | 9/2014 | Yu et al. |
| 2014/0264592 A1 | 9/2014 | Oxland et al. |
| 2014/0335673 A1 | 11/2014 | Kim et al. |
| 2015/0097239 A1* | 4/2015 | Chen .................. H01L 23/3171 257/347 |
| 2015/0228499 A1* | 8/2015 | Parkinson ......... H01L 21/31116 438/694 |
| 2016/0035872 A1* | 2/2016 | Loubet .................. H01L 29/785 257/347 |

OTHER PUBLICATIONS

Office Action Taiwan Patent Application No. 10520857580 dated Jul. 13, 2016.

Non-Final Office Action U.S. Appl. No. 14/856,547 dated Sep. 21, 2016.

Non-Final Office Action U.S. Appl. No. 15/208,393 dated Mar. 27, 2017.

* cited by examiner

US 9,780,214 B2

SEMICONDUCTOR DEVICE INCLUDING FIN- FET AND MANUFACTURING METHOD THEREOF

TECHNICAL FIELD

The disclosure relates to a semiconductor integrated circuit, more particularly to a semiconductor device with a fin field effect transistor (FET) and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin devices (e.g., wrapping) utilizing the advantage of the increased surface area of the channel and source/drain regions to produce faster, more reliable and better-controlled semiconductor transistor devices. In addition, strained materials in source/drain (S/D) portions of the Fin FET utilizing selectively grown silicon germanium (SiGe) may be used to enhance carrier mobility. For example, compressive stress applied to a channel of a PMOS device advantageously enhances hole mobility in the channel. Similarly, tensile stress applied to a channel of an NMOS device advantageously enhances electron mobility in the channel.

However, there are challenges to implementation of such features and processes in complementary metal-oxide-semiconductor (CMOS) fabrication.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
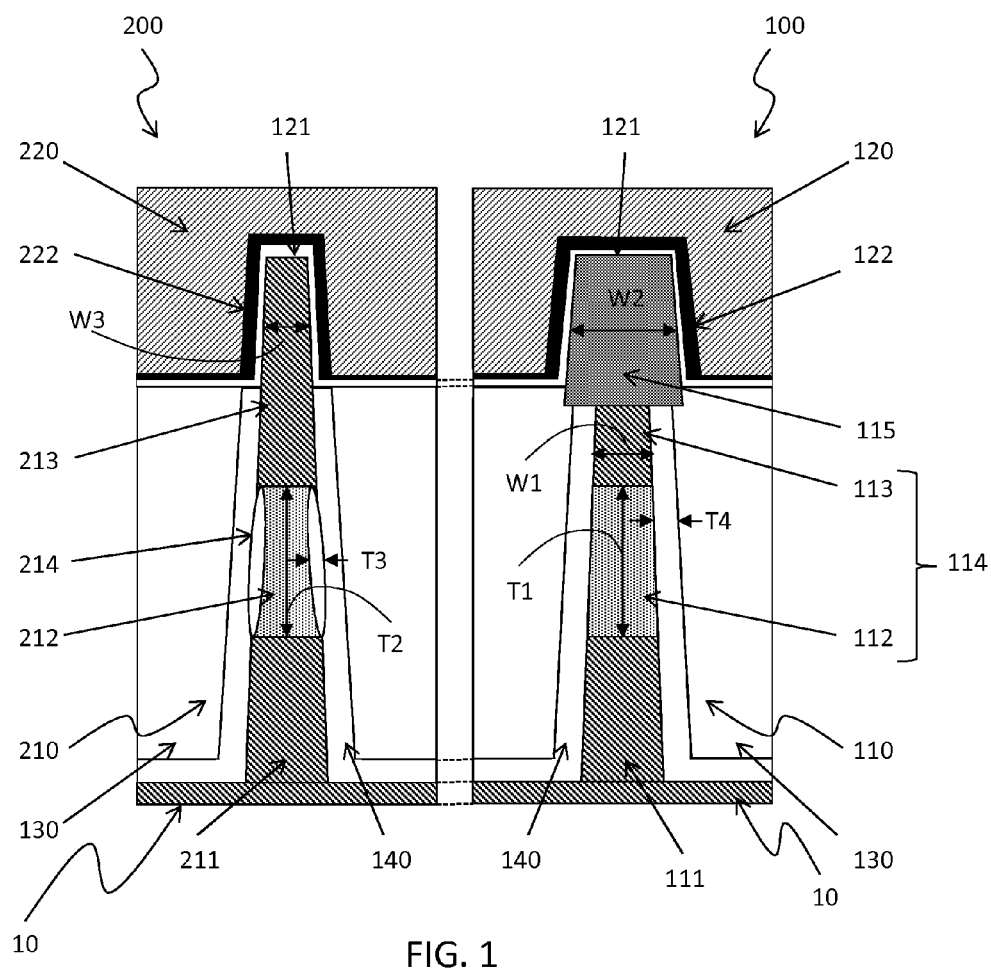
FIG. 1 is an exemplary cross sectional view of the Fin FET device according to one embodiment of the present disclosure.

FIG. 1 shows an exemplary cross sectional view of the Fin FET device according to one embodiment of the present disclosure. The Fin FET device includes an n-channel Fin FET 200 and a p-channel Fin FET 100. Although the n-channel Fin FET 200 and the p-channel Fin FET 100 are separately illustrated in the drawings, the n-channel Fin FET 200 and the p-channel Fin FET 100 are disposed in the same semiconductor device, and some layers are continuously formed in a p-channel Fin FET region and an n-channel Fin FET region.

A first fin structure 110 of the p-channel Fin FET 100 includes a first base layer 111 protruding from a substrate 10. In this embodiment, the substrate 10 is a silicon substrate. Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. An amorphous substrate such as amorphous Si or amorphous SiC, or insulators such as silicon oxide may also be used as the substrate 10. The substrate 10 may include various regions that have been suitably doped (e.g., p-type or n-type conductivity).

A first intermediate layer 114 is disposed over the first base layer 111 and a first channel layer 115 (p-channel layer) is disposed over the first intermediate layer 114. The first base layer 111 may be made of the same material as the substrate 10 and may continuously extend from the substrate 10. The first intermediate layer 114 includes a first semiconductor layer 112 disposed over the first base layer 111 and a second semiconductor layer 113, which is a first strain layer, disposed over the first semiconductor layer 112. In some embodiments, the first semiconductor layer 112 is a SiGe layer and the second semiconductor layer 113 is a Si layer. The width W1 of the second semiconductor layer 113 is in a range of about 8 nm to about 28 nm in some embodiments. The first channel layer 115 is made of SiGe in some embodiments. Because of the hetero structure of the Si strain layer 113 and the SiGe channel layer 115, a compressive stress is applied to a channel of the p-channel Fin FET. The thickness T1 of the first SiGe layer is in a range of about 2 nm to about 40 nm in some embodiments. The average width of the channel layer 115 is greater than the average width of the first strain layer 113 in some embodiments. At the interface between the first strain layer 113 and the channel layer 115, the width of the channel layer 115 is greater than the width of the first strain layer 113. In some embodiments, the average width of the channel layer 115 may be equal to or smaller than the average width of the first strain layer 113.

A second fin structure 210 of the n-channel Fin FET 200 includes a second base layer 211 protruding from the substrate 10, a second strain layer 212 disposed over the second base layer 211 and a second channel layer 213 (n-channel layer) disposed over the second strain layer 212. The first base layer 211 may be made of the same material as the substrate 10 and may continuously extend from the substrate 10. The second strain layer 212 is made of SiGe and the second channel layer 213 is made of Si in some embodiments. The width W3 of the channel layer 213 is in a range of about 8 nm to about 28 nm in some embodiments. Because of the hetero structure of the SiGe strain layer 212 and the Si channel layer 213, a tensile stress is applied to a channel of the n-channel Fin FET. The thickness T2 of the second strain layer 212 is in a range of about 2 nm to about 40 nm in some embodiments.

In the n-channel Fin FET 200 of the present disclosure, the second strain layer 212 further includes SiGe oxide layers 214 disposed over the side walls of the second strain layer 212. The SiGe oxide layers 214 induce an additional tensile stress to the second channel layer 213. The thickness T3 of the SiGe oxide layer 214 is in a range of about 1 nm to about 10 nm in some embodiments. In certain embodiment, the thickness T3 of the SiGe oxide layer 214 is in a range of about 2 nm to about 5 nm. Since oxygen diffuses faster at the center of the SiGe layer, and thus the center of the SiGe layer is oxidized faster, the SiGe oxide layer 214 becomes an "eye" shape as shown in FIG. 1.

In the present disclosure, the shape of the fin structure in the cross section is a tapered shape (e.g., trapezoid). However, the shape is not limited to trapezoid. In some embodiments, the shape of the fin structure in the cross section may be reverse trapezoid, rectangular, mesa, or mixture thereof. A part of the fin structure (e.g., base layer, intermediate layer, strain layer and/or channel layer) may be tapered and/or rectangular. Further, the corners of the fin structures, for example the corners of channel layers, may be rounded.

Each layer of the fin structures is doped with appropriate impurities. For p-channel Fin FET 100, the channel layer 115 is doped with boron (B) or $BF_2$, and for n-channel Fin FET 200, the channel layer 213 is doped with arsenic and/or phosphorous.

The side walls of the first fin structure 110 of the p-channel Fin FET 100 and the side walls of the second fin structure 210 of the n-channel Fin FET 200 are covered by protective layers 140, respectively. The protective layers are made of a material that prevents an underlying layer from oxidizing. In some embodiments, the protective layers are made of silicon nitride (SiN). The thickness T4 of the protective layers is in a range of about 1 nm to about 10 nm in some embodiments. In certain embodiments, the thickness T4 of the protective layers 140 is in a range of about 2 nm to about 5 nm in some embodiments. A height of the first protective layer 140 measured from the substrate is smaller than a height of the second protective layer 240 by a distance in a range of about 10 nm to about 50 nm in some embodiments.

The first fin structure 110 of the p-channel Fin FET 100 and the second fin structure 210 of the n-channel Fin FET 200 are electrically isolated from each other and from adjacent devices by isolation insulating layers 130, respectively. This isolation is called an STI (shallow trench isolation). The isolation insulating layers 130 includes silicon dioxide formed by, for example, a flowable chemical vapor deposition (CVD) in some embodiments.

The p-channel Fin FET 100 further includes a gate dielectric layer 121 and a first gate electrode 120 disposed over the first channel layer 115. A width W2 of the first channel layer 115 covered by the gate electrode 120 may be in a range of about 5 nm to about 40 nm in some embodiments. The n-channel Fin FET 200 also includes the gate dielectric layer 121 and a second gate electrode 220 disposed over the second channel layer 213. A width W3 of the second channel (n-channel) layer 213 covered by the gate electrode 220 may be in a range of about 2 nm to about 20 nm in some embodiments. The material of the gate dielectric layer for the p-channel FET and n-channel FET may be different in some embodiments.

The gate dielectric layer 121 includes a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrodes 120 and 220 include any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-last or replacement gate methodology.

In certain embodiments of the present disclosure, work function adjustment layers 122 and 222 may be interposed between the gate dielectric layers 121 and the gate electrode 120, 220. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

FIGS. 2-9 show cross sectional views of exemplary sequential processes of the Fin FET device according to one embodiment. It is understood that additional operations can be provided before, during, and after processes shown by FIGS. 2-9, and some of the operation described below can be replaced or eliminated, for additional embodiments of the method. The order of the operations/processes may be interchangeable.

Figure 2:
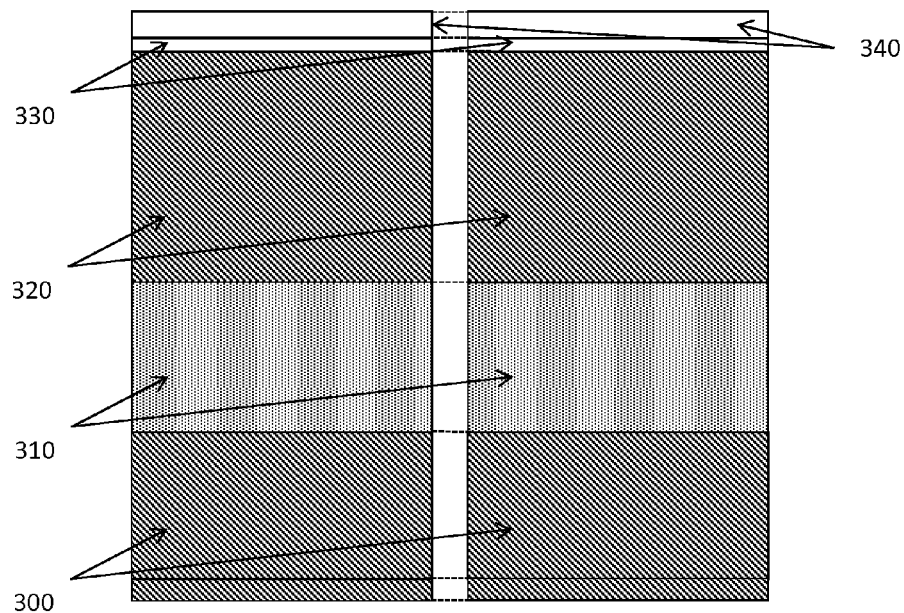
FIGS. 2-9 show exemplary processes for manufacturing the Fin FET device according to the embodiment of the present disclosure.

As shown in FIG. 2, a stacked layer of a base layer 300, an intermediate semiconductor layer 310 and an upper semiconductor layer 320 is provided. In one embodiment, the base layer 300 is silicon, the intermediate semiconductor layer 310 is a SiGe layer and the upper semiconductor layer 320 is silicon. The silicon base layer 300 is a silicon substrate or a silicon layer of an SOI (silicon-on insulator) substrate. The SiGe intermediate layer 310 is an epitaxially grown layer and expressed as $Si_xGe_{(1-x)}$, where x is in a range of about 0.1 to about 0.9. The thickness of the SiGe intermediate layer 310 is in a range of about 10 nm to about 100 nm in some embodiments. In certain embodiments, the thickness of the SiGe intermediate layer 310 is in a range of about 30 nm to about 70 nm. The Si upper layer 320 is an epitaxial grown layer and has a thickness in a range of about 20 nm to about 70 nm in some embodiments. In certain embodiments, the thickness of the Si upper layer 320 is in a range of about 30 nm to about 50 nm.

As shown in FIG. 2, a mask layer is further formed over the upper semiconductor layer 320. The mask layer includes, for example, a pad oxide (e.g., silicon oxide) layer 330 and a silicon nitride mask layer 340 in some embodiments. The thickness of the pad oxide layer 330 is in a range of about 2 nm to about 15 nm and the thickness of the silicon nitride mask layer 340 is in a range of about 10 nm to about 50 nm in some embodiments.

Figure 3:
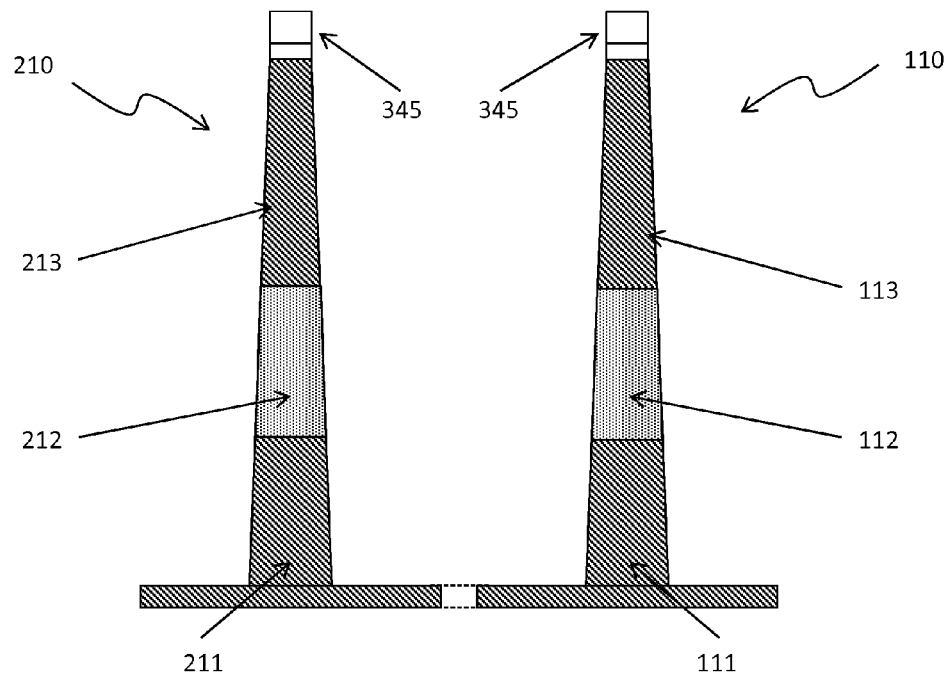

By using a patterning process, hard mask patterns 345 of the pad oxide layer 330 and the silicon nitride mask layer 340 are formed, as shown in FIG. 3. The width of the hard mask patterns 345 is in a range of about 5 nm to about 40 nm in some embodiments. In certain embodiments, the width of the hard mask patterns is in a range of about 10 nm to about 30 nm.

As shown in FIG. 3, by using the hard mask patterns 345 as etching masks, the Si base layer 300, the SiGe intermediate layer 310 and the Si upper layer 320 are pattered into fin structures 110, 210 by trench etching using a dry etching method and/or a wet etching method.

Figure 4:
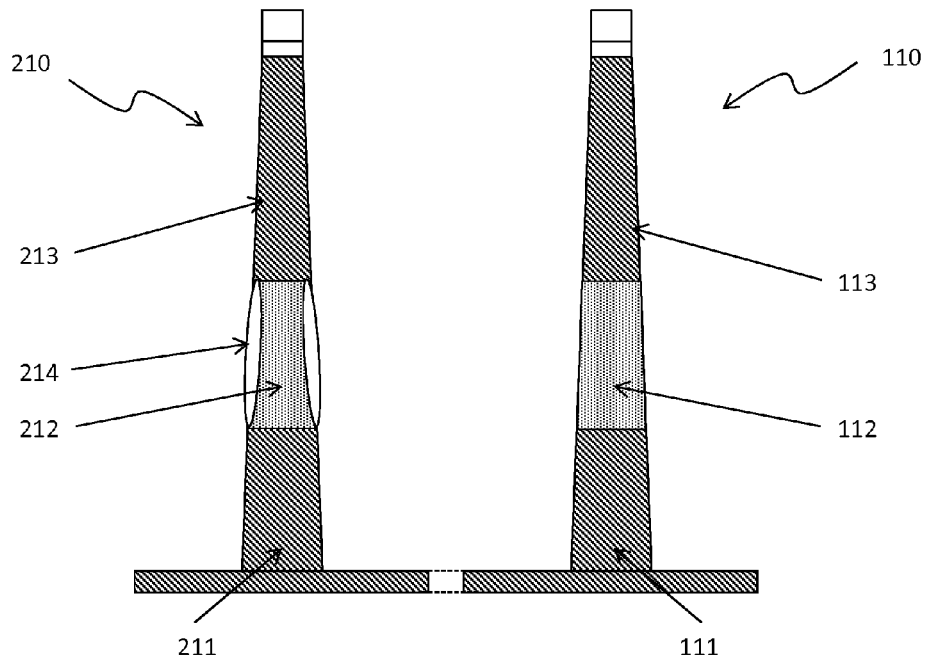

As shown in FIG. 4, side walls of the SiGe layer 212 for the n-channel fin structure are oxidized to form SiGe oxide layers 214. To selectively oxidize the SiGe layer 212 of the second fin structure 210, the first fin structure 110 for the p-channel Fin FET is covered by a silicon nitride layer (not shown). Then, the SiGe layer 212 is selectively oxidized. Although the Si base layer 211 and the Si upper layer 213 are also oxidized, since SiGe (in particular Ge) is oxidized faster than Si, SiGe oxide layers 214 can be selectively formed. The SiGe layer can be oxidized by an annealing or heating in an atmosphere containing oxygen ($O_2$), $O_2$ and hydrogen ($H_2$) or steam ($H_2O$), at a temperature in a range of about 300° C. to about 1000° C. in some embodiments. Since the side walls of the SiGe layer 112 is covered by the silicon nitride layer, the SiGe layer 112 of the p-channel fin structure is not oxidized. After the SiGe layer 212 is selectively oxidized, the silicon nitride layer covering the p-channel fin structure is removed, for example, by dry etching or wet etching. Since oxygen diffuses faster at the center of the SiGe layer, and thus the center of the SiGe layer is oxidized faster, the SiGe oxide layer 214 becomes an "eye" shape as shown in FIG. 4.

Figure 5:
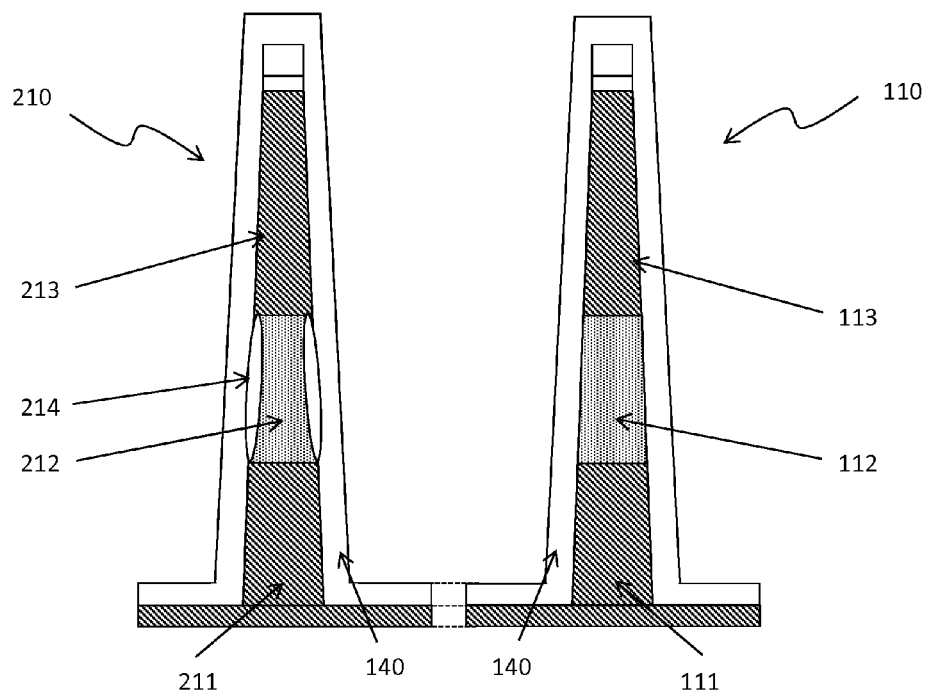

As shown in FIG. 5, protective layers 140 are formed to cover the first fin structure 110 and the second fin structure 210, respectively. The protective layers 140 are made of a material that prevents an underlying layer from oxidizing. In the present embodiment, silicon nitride (SiN) is used as the protective layers. SiCN, SiOCN or SiC may also be used as the protective layer. The SiN layer may be deposited by physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer deposition (ALD), and/or other processes. In a LPCVD or plasma CVD process, a silicon source such as $Si_2H_6$, $SiH_4$ and/or $Si_2Cl_6$ and a nitrogen source such as $NH_3$ and/or $N_2$ are used and the SiN film is formed at a temperature in a range of about a room temperature to about 1000° C. under a reduced pressure in a range of about 0.01 to 10 Torr (about 1.33 Pa to about 1333 Pa) to in some embodiments.

The thickness of the protective layers is in a range of about 1 nm to about 10 nm in some embodiments. In certain embodiments, the thickness of the protective layers is in a range of about 2 nm to about 5 nm.

As long as the side walls of the SiGe layers 112 and 212 are fully covered by the protective layers 140, the protective layers do not necessarily cover the entire side walls of the Si base layer 111, 211 and the Si upper layer 113, 213.. In other words, the protective layers may partially cover the side walls of the Si base layer 111, 211 and the Si upper layer 131, 231.

Figure 6:
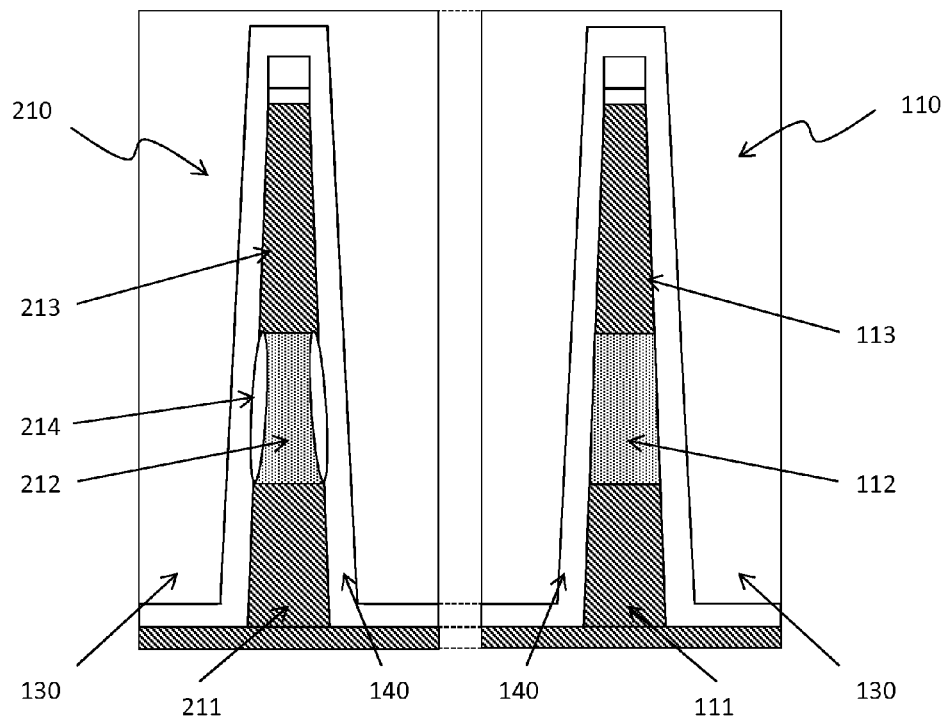

Next, as shown in FIG. 6, isolation insulating layers 130 are formed. The isolation insulating layers 130 for the p-channel region and the n-channel region are substantially the same between the n-channel Fin FET and the p-channel Fin FET, and formed at the same time. The isolation insulating layers 130 are made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen sisesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once at temperatures, such as in a range from about 1000° C. to about 1200° C., and for an extended period, such as 30 hours or more in total. The isolation insulating layers 130 may be formed by SOG. SiO, SiON, SiOCN or fluoride-doped silicate glass (FSG) may be used as the isolation insulating layer in some embodiments.

After forming the isolation insulating layers 130, a thermal process, for example, an anneal process, is performed to improve the quality of the isolation insulating layers. Since the side walls of the SiGe layers 112 and 212 are covered by the protective layers 140, respectively, the SiGe layers 112 and 212 are not oxidized during the thermal process for forming the isolation insulating layers 130.

Figure 7:
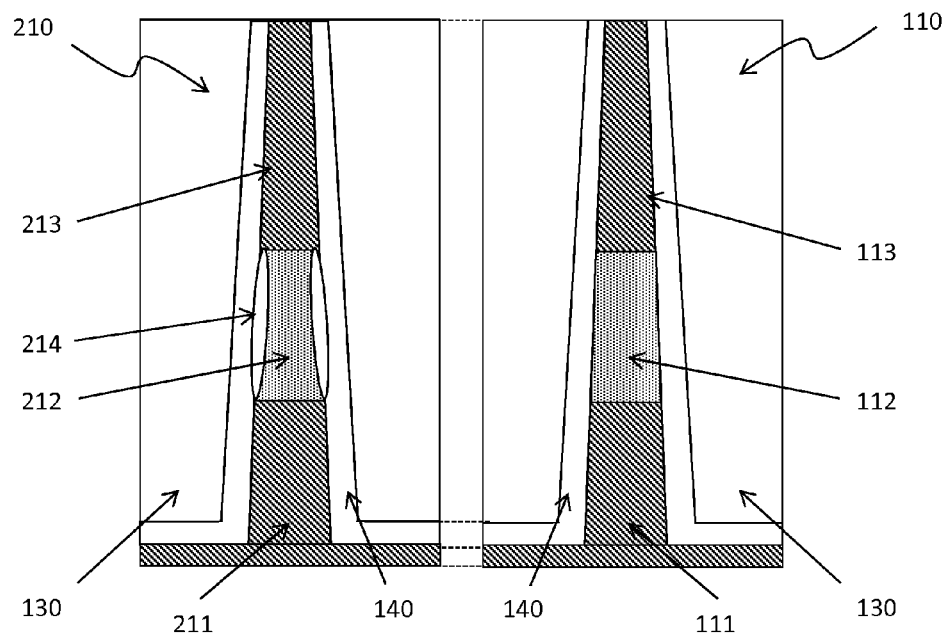

As shown in FIG. 7, the hard mask patterns 345 and top portions of the isolation insulating layers 130 and the protective layers 140 are removed by, for example, a chemical mechanical polishing (CMP) method or other planarization methods such as an etch-back process. The top portions of the Si upper layers 113 and 213 may be slightly etched.

Figure 8:
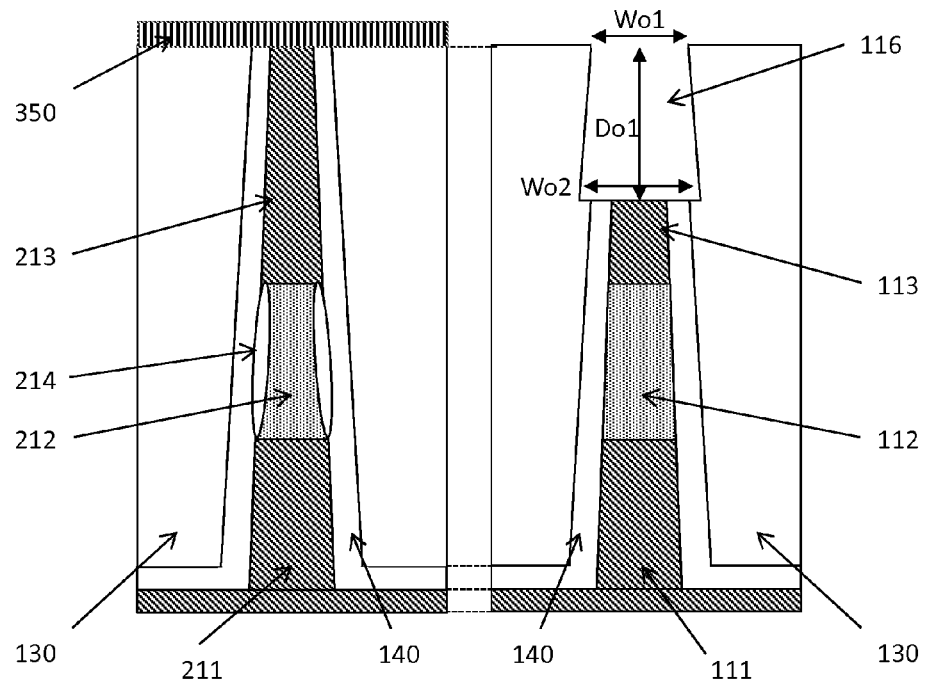

Next, as shown in FIG. 8, a protection hard mask layer 350, for example, a bilayer of silicon nitride (in a range of about 10 nm to about 50 nm in some embodiments) and silicon oxide (in a range of about 5 nm to 50 nm in some embodiments), is formed over the isolation insulating layer 130 in the n-channel Fin FET region. The protection hard mask layer 350 protects the n-channel Fin FET from the subsequent processes performed on the p-channel Fin FET. By using a patterning process, an opening 116 is formed by partially removing the isolation insulating layer 130, the protective layer 140, and the first silicon layer 113. The width Wo1 of the top of the opening 116 is in a range of about 5 nm to about 40 nm, the width Wo2 of the bottom of the opening 116 is in a range of about 5 nm to about 40 nm, and the depth Do of the opening 116 is in a range of about 10 nm to about 50 nm, in some embodiments. In one embodiment, the width of the bottom of the opening 116 is greater than the width of the top of the opening 116. However, the width of the bottom of the opening 116 may be the same as or smaller than the width of the top of the opening 116. The cross sectional shape of the opening 116 may be trapezoid, reverse-trapezoid, rectangular or a barreled shape. On the bottom of the opening, an etched surface of the Si layer 113 is exposed.

Then, a SiGe layer 115 is epitaxially grown on the exposed surface of the Si layer 113 so as to fill the opening 116. The epitaxial growth of the SiGe layer may be performed by using $SiH_4$ and/or $SiH_2Cl_2$ and $GeH_4$ as source gases at a temperature in a range of about 500 C to 700 C and at a pressure in a range of about 10 to 100 Torr (about 133 Pa to about 1333 Pa).

The SiGe layer 115 is expressed as $Si_xGe_{(1-x)}$, where x is in a range of about 0.1 to about 0.9 in some embodiments. Subsequently, an unnecessary SiGe layer and the protective hard mask 350 are removed by, for example, a CMP method, as shown in FIG. 9.

Figure 9:
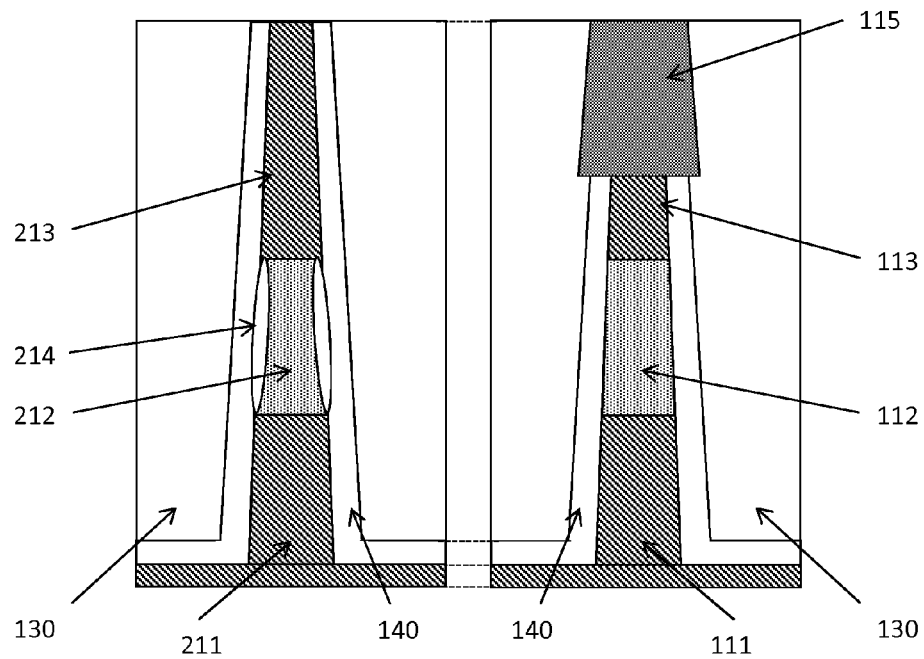

After the fin structures 110, 210 are formed, as shown in FIG. 9, the gate structure as shown in FIG. 1 is formed.

The gate dielectric layer 121 is formed by CVD, PVD, ALD e-beam evaporation, or other suitable process. When the gate dielectric layer 121 is silicon oxide, $SiH_4$, $Si_2H_6$ and/or $Si_2Cl_6$ is used as a source gas. When the gate dielectric layer 121 is silicon nitride, $SiH_4$, $Si_2H_6$ and/or $Si_2Cl_6$ and $NH_3$ are used as source gases. When the gate dielectric layer 121 is hafnium oxide, zirconium oxide, aluminum oxide or titanium oxide, metal hydride, metal chloride and/or organic metal including Hf, Zr, Al or Ti is used as a source gas.

The gate electrodes 120 and 220 may be formed by a film forming process by using ALD, PVD, CVD, e-beam evaporation, electroplating or other suitable process, and a patterning process. Metal hydride, metal chloride and/or organic metal including Ti, Ta, Co, Si, Zr, Al or W is used as a source gas. Further, the gate electrodes 120 and 220 may be formed separately for the n-channel Fin FET 200 and the p-channel Fin FET 100 which may use different metal layers. The gate structure may be formed using a gate-last or replacement gate methodology.

Figure 10:
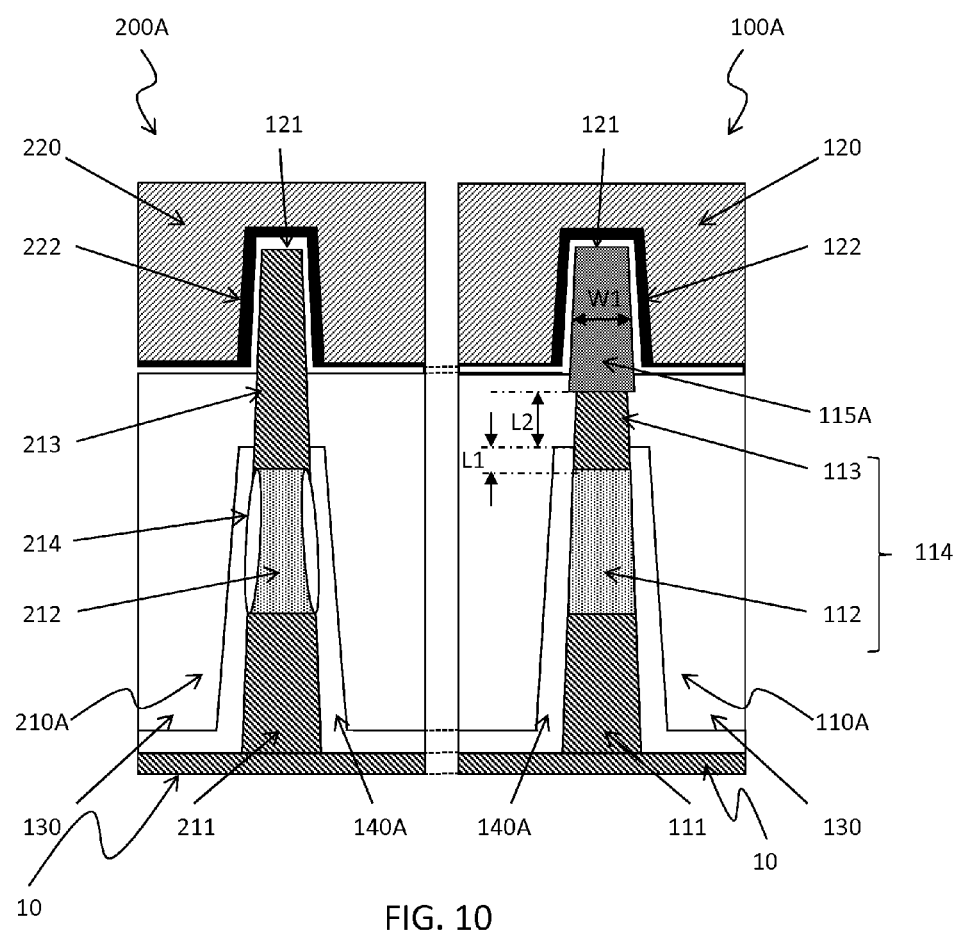
FIG. 10 is an exemplary cross sectional view of the Fin FET device according to another embodiment of the present disclosure.
Figure 11:
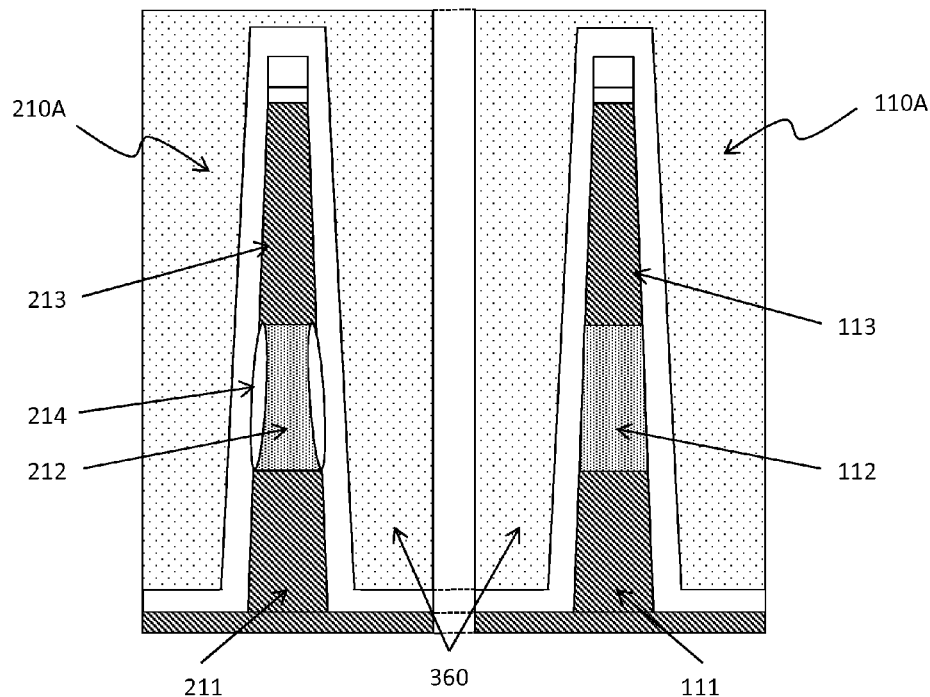
FIGS. 11-16 show exemplary processes for manufacturing the Fin FET device according to another embodiment of the present disclosure.

FIG. 10 shows an exemplary cross sectional view of the Fin FET device according to another embodiment of the present disclosure. The Fin FET device includes a p-channel Fin FET 100A and an n-channel Fin FET 200A. Although the n-channel Fin FET 200A and the p-channel Fin FET 100A are separately illustrated in the drawings, the n-channel Fin FET 200A and the p-channel Fin FET 100A are disposed in the same semiconductor device, and some layers are continuously formed in a p-channel Fin FET region and an n-channel Fin FET region. At a minimum, the Fin FET device of this embodiment is different from that of the embodiment described above in the structure of the protective layers.

As shown in FIG. 10, the protective layer 140A for the p-channel Fin FET covers the side walls of the first base layer 111 and the side walls of the SiGe layer 112, but covers only a part of the side walls of the strain layer 113. As a result, the protective layer 140A is spaced apart from the first channel layer 115A.

The distance (length L1) that the first protective layer covers the part of the side walls of the strain layer 113 is in a range of about 1 nm to about 10 nm to effectively protect the SiGe layer in some embodiments. In certain embodiments, the distance L1 is in a range of about 2 to about 5 nm. The distance (space L2) between the first protective layer 140A and the first channel layer 115A is in a range of about 2 nm to about 20 nm in some embodiment, allowing the width of the channel layer to be smaller. In certain embodiments, the distance L2 is in a range of about 4 nm to about 10 nm.

In this embodiment, a width W1 of the first channel layer covered by the gate electrode 120 is at most about 40 nm in some embodiments. In certain embodiments, the width W is at most about 30 nm. At the interface between the strain layer 113 and SiGe channel layer 115A, the width of the SiGe channel layer 115A is greater than the width of the strain layer 113. In some embodiments, the average width of the channel layer 115A may be equal to or smaller than the average width of the strain layer 113.

Similarly, in the n-channel Fin FET 200A, the protective layer 214 covers only the bottom portion of the strain layer 213 by a distance in a range of about 1 nm to about 10 nm in some embodiments. In certain embodiments, this distance is in a range of about 2 to about 5 nm.

In this embodiment, the height of the first protective layer 140A is substantially equal to the height of the second protective layer 240A. Here, "substantially equal" means that a difference is less than 2-3 nm. When the depths of the fin structures are not uniform, the height from the substrate may be measured from the plane that corresponds to the average depths of the fin structures.

FIGS. 11-16 show cross sectional views of exemplary sequential processes of the Fin FET device according to another embodiment. It is understood that additional operations can be provided before, during, and after processes shown by FIGS. 11-16, and some of the operations described below can be replaced or eliminated, for additional embodiments of the method. The order of the operations/processes may be interchangeable.

The manufacturing method of the Fin FET of the second embodiment includes the same steps shown in FIGS. 2-5.

After the fin structures shown in FIG. 5 are formed, a sacrificial layer 360 is formed so that the fin structures are embedded in the sacrificial layer 360. The fin structures 110A and 210A may be fully or partially embedded in the sacrificial layer 360. In this embodiment, the sacrificial layer is a photo resist layer. The photo resist layer is formed by spin coating.

Figure 12:
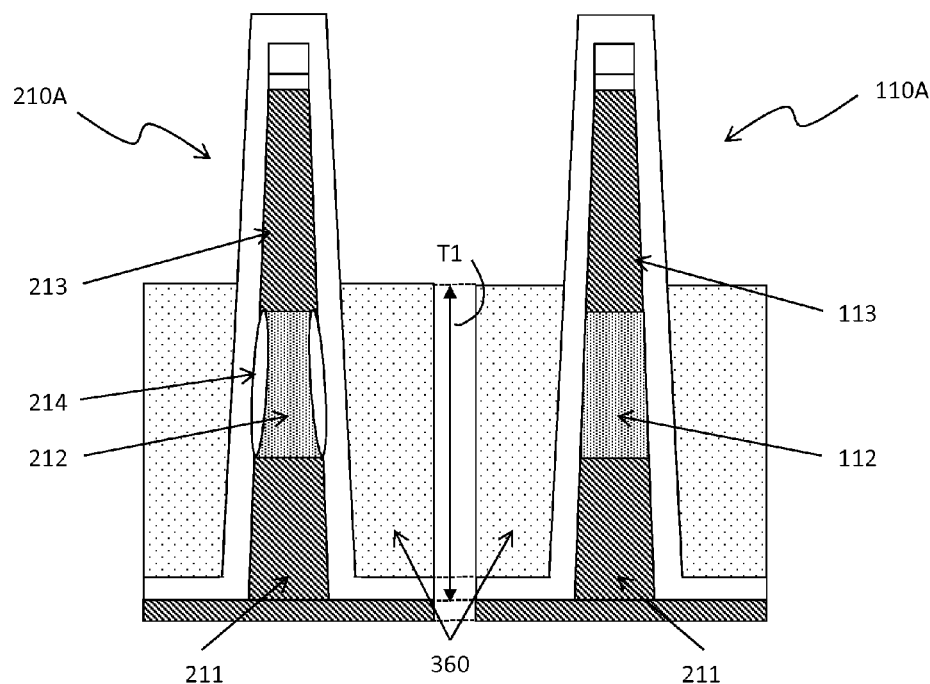

Then, as shown in FIG. 12, the thickness of the sacrificial layer 360 is reduced by, for example, an etch-back process so as to expose a part of the fin structures. The etch-back process of the photo resist may be performed by using plasma including $O_2$ and at least one of $CF_4$ and $CHF_3$, at a temperature in a range about 0° C. to about 300° C. and at a pressure in a range of about 1 to about 10 Torr (about 133 Pa to about 1333 Pa) in certain embodiments. By adjusting etching time, a desired thickness of the remaining photo resist layer can be obtained. In the present disclosure, the thickness T1 is adjusted to be greater than the height of the SiGe layers 112, 212 by a range of about 1 nm to about 10 nm in some embodiments.

Instead of etching-back the thick resist layer, it may be possible to form a thin sacrificial layer of the photo resist having the thickness T1 directly by adjusting, for example, the spin coating condition. The photo resist layer may be replaced with any organic resin (e.g., non-photosensitive resins) layer or inorganic layer. A material for a bottom anti-reflection coating may be used.

Figure 13:
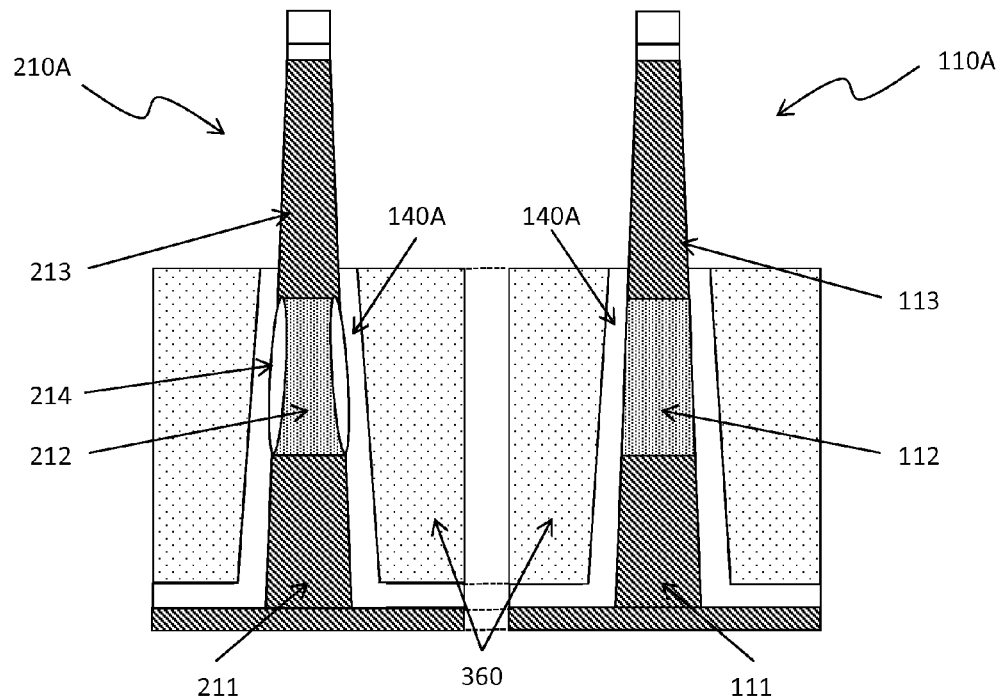

Next, as shown in FIG. 13, the upper portions of the SiN protective layer are removed by plasma etching or wet etching. In certain embodiments, the hard mask patterns 345 are also removed in this process.

Figure 14:
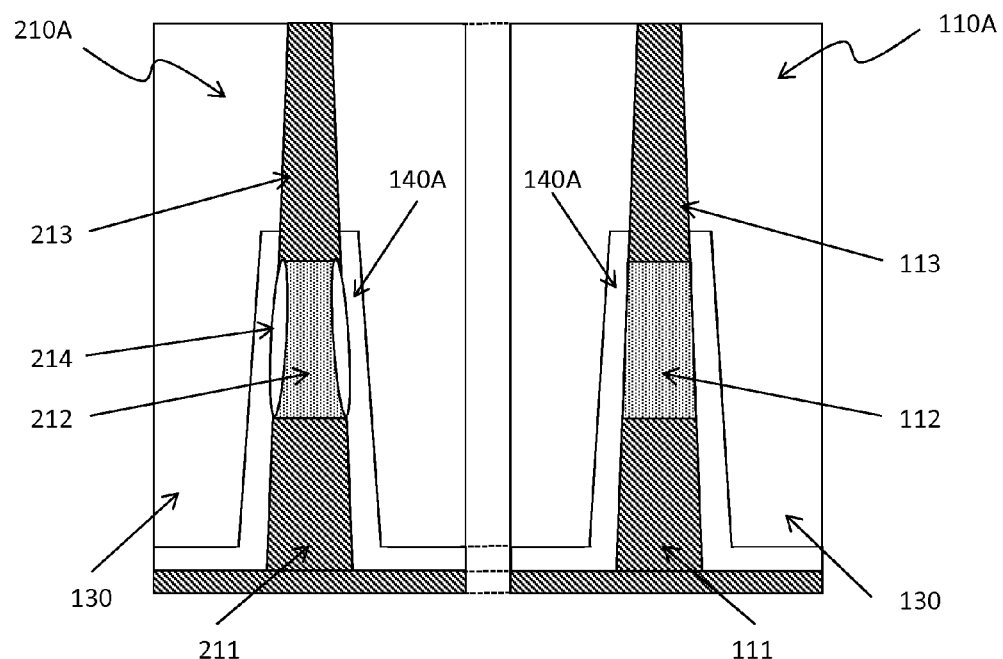

The remaining sacrificial layer 360 is removed by, for example, an ashing process and/or a wet cleaning process. Similar to FIGS. 6 and 7, isolation insulating layers 130 are formed and the hard mask patterns 345 are removed, as shown in FIG. 14.

After the removal of the part of the protecting layer, a height of the first protective layer 140A and a height of the second protective layer 240A are substantially equal to each other.

Figure 15:
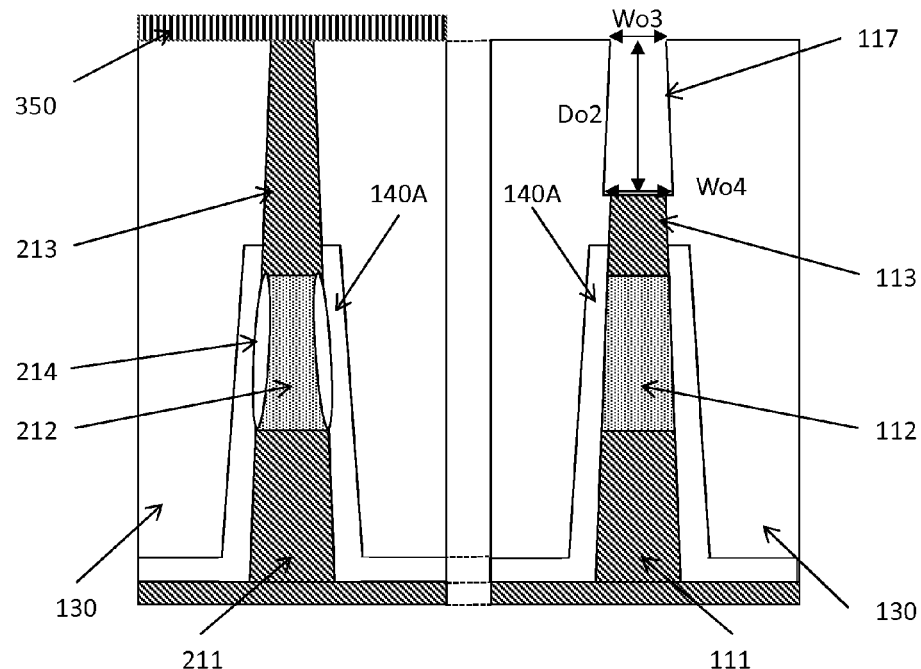

Then, similar to FIG. 8, a protection hard mask layer 350 is formed over the isolation insulating layer 130 in the n-channel Fin FET region as shown in FIG. 15. By using a patterning process, an opening 117 is formed by partially removing the isolation insulating layer 130, and the first silicon layer 113. The width Wo3 of the top of the opening 117 is in a range of about 5 nm to about 40 nm, the width Wo4 of the bottom of the opening 117 is in a range of about 5 nm to about 40 nm, and the depth Do2 of the opening 117 is in a range of about 10 nm to about 100 nm in some embodiments. In one embodiment, the width Wo4 of the bottom of the opening 117 is greater than the width Wo3 of the top of the opening 117. However, the width of the bottom of the opening 117 may be the same as or smaller than the width of the top of the opening 117. The cross sectional shape of the opening 117 may be trapezoid, reverse-trapezoid, rectangular or a barreled shape. On the bottom of the opening, an etched surface of the strain layer 113 is exposed.

In this embodiment, since it is not necessary to etch the SiN protective layer when forming the opening 117, the width of the opening 117 can be made smaller.

Then, a SiGe layer 117 is epitaxially grown on the exposed surface of the Si layer 113 so as to fill the opening 117. Subsequently, an unnecessary SiGe layer and the protective hard mask 350 are removed by, for example, a CMP method, as shown in FIG. 16.

Figure 16:
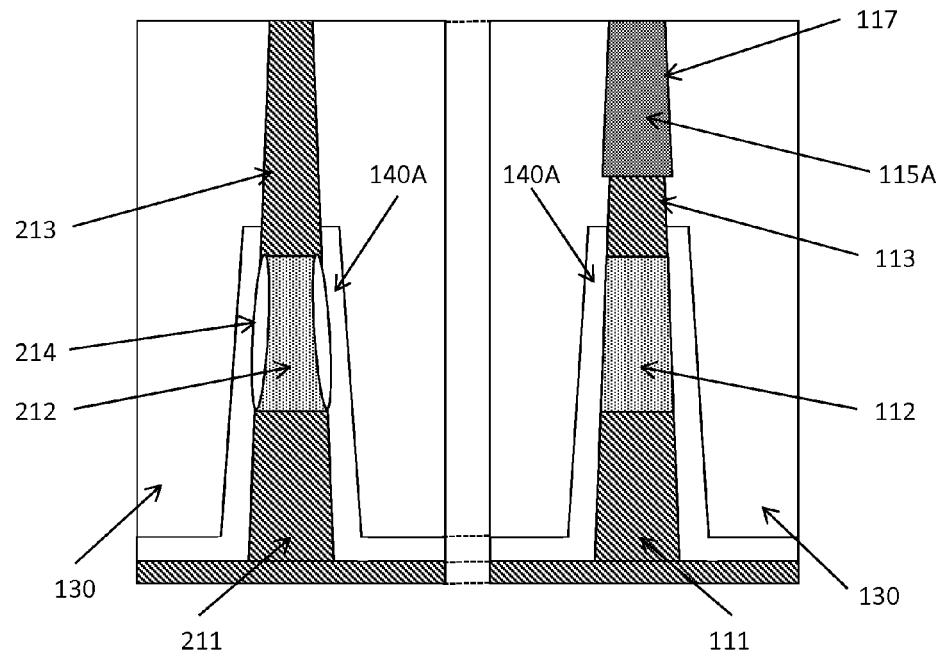

After the fin structures 110A, 210A are formed as shown in FIG. 16, the gate structure as shown in FIG. 10 is formed.

FIGS. 17-20 show cross sectional views of exemplary sequential processes of the Fin FET device according to another embodiment for another embodiment. The another embodiment of the manufacturing method of the Fin FET of the another embodiment includes the same steps shown in FIGS. 2-5.

Figure 17:
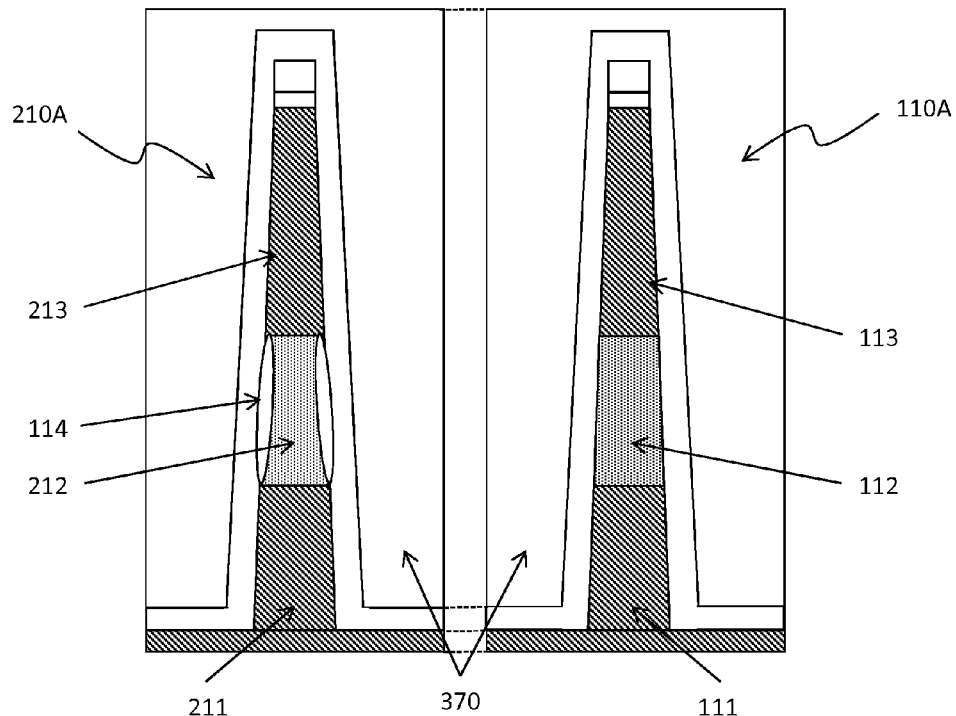
FIGS. 17-20 show other exemplary processes for manufacturing the Fin FET device according to another embodiment of the present disclosure.

After the fin structures shown in FIG. 5 are formed, as shown in FIG. 17, an insulating layer 370 is formed so that the fin structures 110A, 210A are embedded in the insulating layer 370. The fin structures 110A and 210A may be fully or partially embedded in the insulating layer 370. The insulating layer 370 is made of the same material as the isolation insulating layer, and formed by LPCVD, plasma CVD, flowable CVD or an SOG method.

Figure 18:
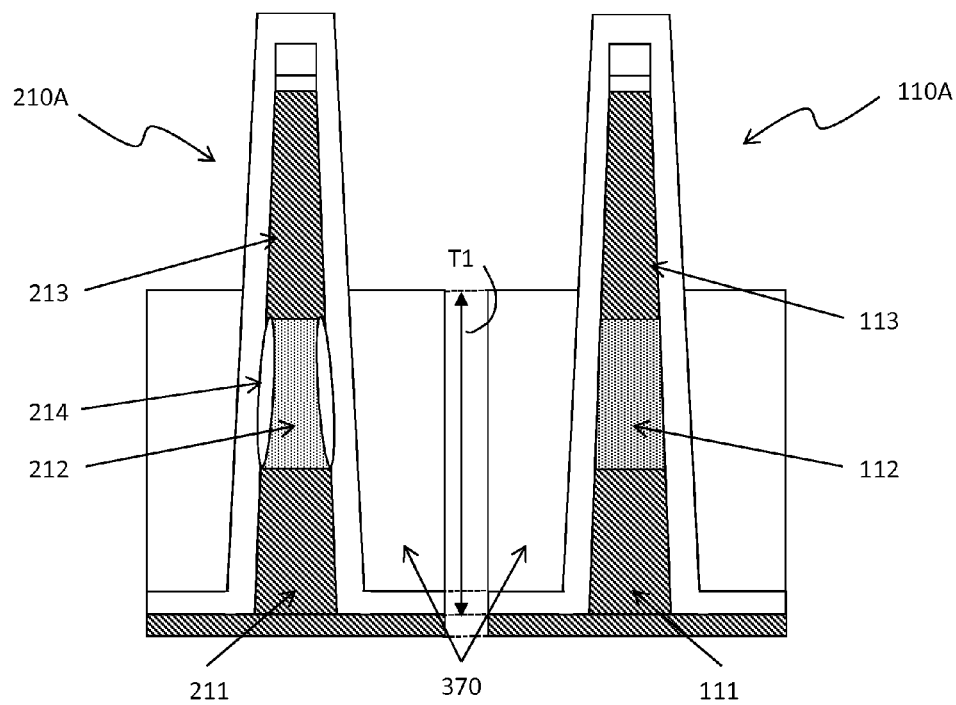

Then, similar to FIG. 12, the thickness of the insulating layer 370 is reduced by, for example, an etch-back process so as to expose a part of the fin structures, as shown in FIG. 18. The etch-back process may be performed by using dry etching or wet etching. By adjusting etching time, a desired thickness of the remaining insulating layer 370 can be obtained. In the present disclosure, the thickness T1 is adjusted to be greater than the height of the SiGe layers 112, 212 by a range of about 1 nm to about 10 nm in some embodiments.

In another embodiment, a thin insulating layer having the thickness T1 is formed directly by adjusting, for example, the deposition condition in LPCVD, plasma CVD, flowable CVD or an SOG method.

Figure 19:
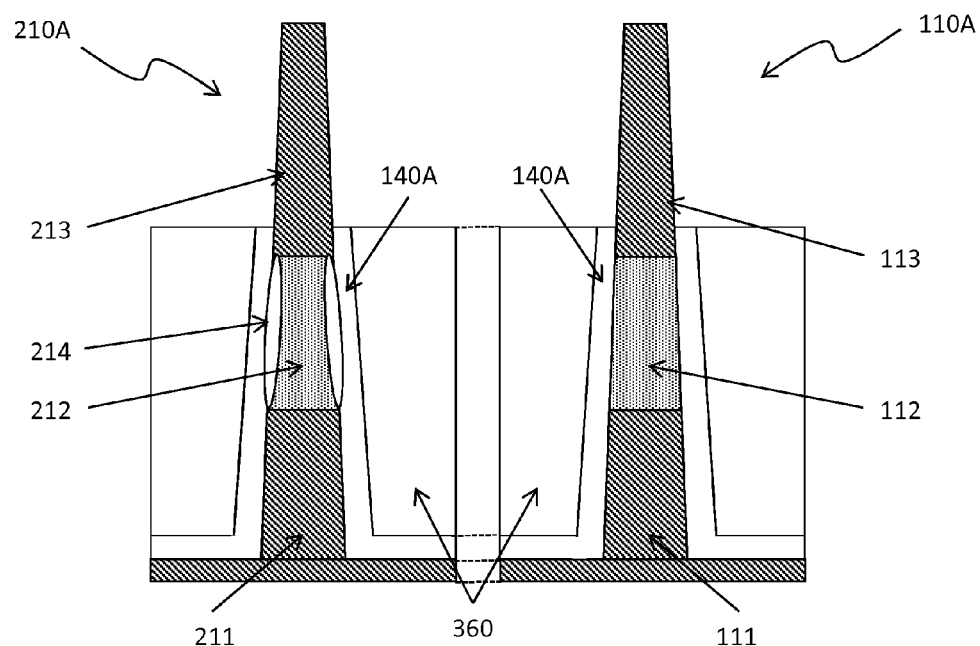

Next, as shown in FIG. 19, similar to FIG. 13, the upper portions of the SiN protective layer are removed by plasma etching or wet etching. The hard mask patterns 345 may be also removed in this process.

Figure 20:
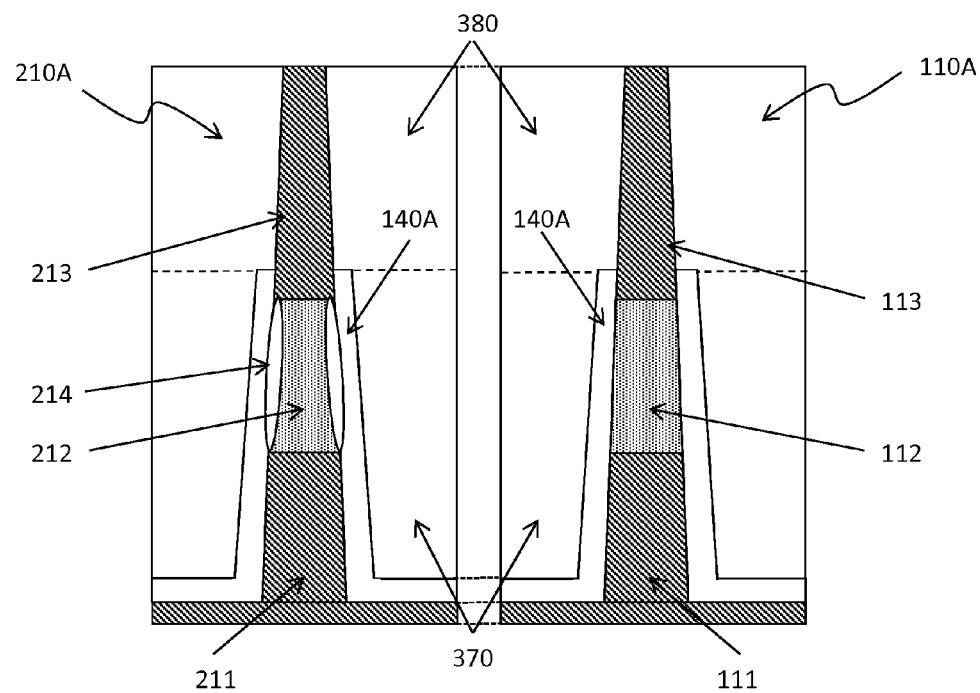

After the SiN protective layers are partially removed, an additional insulating layer 380 is deposited on the remaining insulating layer 370, by and a planarization process by using a CMP process is performed, as shown in FIG. 20. The additional insulating layer 380 is made of the same material as the isolation insulating layer, and formed by LPCVD, plasma CVD, flowable CVD or SOG. The insulating layer 370 and the additional insulating layer 380 constitute the isolation insulating layers 130. The material and forming method for the insulating layer 370 may be different from the material and forming method for the additional insulating layer 380.

After the completion of the process shown in FIG. 20, the same processes shown in FIGS. 15 and 16 are performed so as to complete the fin structures. After the fin structures 110A, 210A are formed as shown in FIG. 16, the gate structure as shown in FIG. 10 is formed.

In this embodiment, as shown in FIG. 18-20, the insulating layer 370 remains and the additional insulating layer 380 is further deposited. However, it is possible to remove the remaining insulating layer 370 after the process shown in FIG. 19 and the additional insulating layer 380 (i.e., an isolation insulating layer) is formed, similar to the processes shown in FIGS. 13-14.

The various embodiments described herein offer several advantages over the existing art. For example, in the present disclosure, since the intermediate SiGe layers in the fin structures are covered by protective layers (e.g., SiN) for preventing oxidation, oxidation of the SiGe layers in the subsequent heating process such as annealing can be effectively prevented. In addition, it is possible to prevent strain relaxation and fin bending which would occur in the subsequent heating process. Further, by removing the protective layers before forming an opening for the p-channel SiGe layer, it is possible to further reduce the width of the fin structure for the p-channel Fin FET.

It will be understood that not all advantages have been necessarily discussed herein, no particular advantage is required for all embodiments, and other embodiments may offer different advantages.

In accordance with one aspect of the present disclosure, a semiconductor device includes a fin structure for a fin field effect transistor (FET). The fin structure includes a base layer protruding from a substrate, an intermediate layer disposed over the base layer and an upper layer disposed over the intermediate layer. The fin structure further includes a protective layer made of a material that prevents an underlying layer from oxidizing. The intermediate layer includes a first semiconductor layer disposed over the base layer, and the protective layer covers at least side walls of the first semiconductor layer.

In accordance with another aspect of the present disclosure, a semiconductor device includes a first fin structure for a first FET and a second fin structure for a second fin FET. The first fin structure includes a first base layer protruding from a substrate, a first intermediate layer disposed over the first base layer and a first channel layer disposed over the first intermediate layer. The first fin structure also includes a first protective layer made of a material that prevents an underlying layer from oxidizing. The second fin structure includes a second base layer protruding from the substrate, a second intermediate layer disposed over the second base layer and a second channel layer disposed over the second intermediate layer. The second fin structure also includes a second protective layer covering side walls of the second base layer, side walls of the second intermediate layer and side walls of the second channel layer. The first channel layer is made of SiGe. The first intermediate layer includes a first semiconductor layer disposed over the first base layer and a second semiconductor layer disposed over the first semiconductor layer. The first protective layer covers side walls of the first base layer, side walls of the first semiconductor layer and side walls of a part of the second semiconductor layer.

In accordance with yet another aspect of the present disclosure, a method for manufacturing a semiconductor device includes the following steps. A fin structure including a lower layer, an intermediate layer disposed over the lower layer and an upper layer disposed over the intermediate layer is formed. A protective layer is formed over at least side walls of the fin structure to cover side walls of the intermediate layer. The protective layer is made of a material that prevents an underlying layer from oxidation. An isolation insulating layer is formed so that the fin structure with the protective layer is embedded in the isolation insulating layer. A part of the upper layer and the isolation insulating layer are removed so that an opening is formed in the isolation insulating layer. A channel layer is formed in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a fin structure for a fin field effect transistor (FET), the fin structure comprising a base layer protruding from a substrate, an intermediate layer disposed over the base layer and an upper layer disposed over the intermediate layer;
an isolation insulating layer disposed on the substrate; and
a protective layer made of a material that prevents an underlying layer from oxidizing, wherein:
the intermediate layer includes a first semiconductor layer disposed over the base layer,
the protective layer covers at least a sidewall of the first semiconductor layer,
the intermediate layer further includes a second semiconductor layer disposed over the first semiconductor layer,
the upper layer is a channel layer including SiGe,
the protective layer covers a part of sidewall of the second semiconductor layer and sidewalls of the base layer,
the protective layer does not cover a sidewall of the upper layer and is spaced apart from the channel layer, and
the base layer and the protective layer are embedded in the isolation insulating layer.

2. The semiconductor device of claim 1, wherein a thickness of the protective layer is 1 to 10 nm.

3. The semiconductor device of claim 1, wherein the protective layer is made of silicon nitride.

4. The semiconductor device of claim 1, wherein the protective layer is spaced apart from the bottom of the opening by a distance of 2 to 20 nm.

5. A semiconductor device, comprising:
a first fin structure for a first fin field effect transistor (FET), the first fin structure comprising a first base layer protruding from a substrate, a first intermediate layer disposed over the first base layer and a first channel layer disposed over the first intermediate layer; and
a first protective layer made of a material that prevents an underlying layer from oxidizing;
a second fin structure for a second fin FET, the second fin structure comprising a second base layer protruding from the substrate, a second intermediate layer disposed over the second base layer and a second channel layer disposed over the second intermediate layer; and
a second protective layer covering a sidewall of the second base layer, a sidewall of the second intermediate layer and a sidewall of the second channel layer, wherein:
the first channel layer is made of SiGe,
the first intermediate layer includes a first semiconductor layer disposed over the first base layer and a second semiconductor layer disposed over the first semiconductor layer,
the first protective layer covers a sidewall of the first base layer, a sidewall of the first semiconductor layer and a sidewall of a part of the Si layer, and
the first protective layer is spaced apart from the first channel layer.

6. The semiconductor device of claim 5, wherein a height of the first protective layer is smaller than a height of the second protective layer.

7. The semiconductor device of claim 5, wherein a difference between a height of the first protective layer is substantially equal to a height of the second protective layer.

8. The semiconductor device of claim 5, wherein a distance of the first protective layer covering the sidewall of a part of the second semiconductor layer is 1 to 10 nm.

9. The semiconductor device of claim 5, wherein the first protective layer is spaced apart from the first channel layer by a distance of 2 to 20 nm.

10. The semiconductor device of claim 5, wherein a width of the first channel layer is at most 40 nm.

11. The semiconductor device of claim 5, further comprising:
a first gate dielectric layer disposed over the first channel layer and a first gate electrode disposed over the first dielectric layer; and
a second gate dielectric layer disposed over the second channel layer and a second gate electrode disposed over the second dielectric layer.

12. The semiconductor device of claim 11, further comprising:
a first metal layer disposed between the first gate dielectric layer and the first gate electrode; and
a second metal layer disposed between the second gate dielectric layer and the second gate electrode.

13. The semiconductor device of claim 5, wherein the sidewall of the second intermediate layer is covered by a SiGe oxide.

14. A semiconductor device, comprising:
a fin structure for a fin field effect transistor (FET), the fin structure comprising a base layer protruding from a substrate, a first semiconductor layer disposed over the base layer and a second semiconductor layer disposed over the first semiconductor layer; and
an isolation insulting layer disposed on the substrate;

a protective layer, wherein:
the first semiconductor layer has a different lattice constant from the base layer and the second semiconductor layer, and
the protective layer covers an entire sidewall of the first semiconductor layer, a sidewall of a bottom part of the second semiconductor layer and a sidewall of the base layer, and
the base layer and the protective layer are embedded in the isolation insulating layer.

15. The semiconductor device of claim 14, wherein the first semiconductor layer is made of SiGe.

16. The semiconductor device of claim 14, wherein the protective layer is made of silicon nitride.

17. The semiconductor device of claim 14, wherein:
the second semiconductor layer includes a lower semiconductor layer disposed over the first semiconductor layer and an upper semiconductor layer disposed over the lower semiconductor layer, and
at least the lower semiconductor layer has a different lattice constant from the first semiconductor layer.

18. The semiconductor device of claim 14, wherein:
a sidewall of the first semiconductor layer is covered by a SiGe oxide layer, and
the SiGe oxide layer is covered by the protective layer.

* * * * *